United States Patent [19]

Holzl et al.

[11] 4,202,080

[45] May 13, 1980

[54] MASS SPECTROMETER FILTER

[75] Inventors: Robert A. Holzl, La Canada; Frederick P. Pickett, Sierra Madre; James L. Lawrence, Jr., La Canada, all of Calif.

[73] Assignee: U.T.I.-Spectrotherm Corporation, Sunnyvale, Calif.

[21] Appl. No.: 25,568

[22] Filed: Mar. 30, 1979

Related U.S. Application Data

[60] Continuation of Ser. No. 768,173, Feb. 14, 1977, abandoned, which is a division of Ser. No. 612,551, Sep. 11, 1975, abandoned.

[51] Int. Cl.² .............................................. H01J 9/14
[52] U.S. Cl. ..................................... 29/25.18; 29/423; 29/527.2
[58] Field of Search ................. 29/25.11, 25.14, 25.18, 29/423, 527.2, 469.5

[56] References Cited

U.S. PATENT DOCUMENTS

| | | | |
|---|---|---|---|
| 2,905,573 | 9/1959 | Marvin | 29/527.2 |
| 2,944,338 | 7/1960 | Craig | 29/527.2 X |
| 3,419,951 | 1/1969 | Carlson | 29/423 X |
| 3,533,153 | 10/1970 | Melill et al. | 29/423 |

*Primary Examiner*—Richard B. Lazarus
*Attorney, Agent, or Firm*—Limbach, Limbach & Sutton

[57] ABSTRACT

A process for producing mass filters for use in mass spectrometers. Several electrodes having precisely shaped surfaces must be held in precisely determined positions with respect to each other. Insulators are placed into position on the surface of a mandrel and a layer of metal is deposited over the mandrel and insulators to form a composite unitary structure, including the electrodes. The deposited metal overlying the insulators is then removed, electrically isolating the electrodes.

28 Claims, 8 Drawing Figures

MASS SPECTROMETER FILTER

This is a continuation of Application Ser. No. 768,173, filed Feb. 14, 1977, which in turn is a division of Application Ser. No. 612,551, filed Sept. 11, 1975, both are now abandoned.

BACKGROUND OF THE INVENTION

1. Field of the Invention

The present invention is in the field of mass spectrometers and more particularly is concerned with an improved structure and method for producing a mass filter for use in a mass spectrometer.

2. Description of the Prior Art

A type of mass spectrometer comprises an ion source, a mass filter and an ion collector disposed along a common axis is an evacuatable enclosure. A gas to be analyzed is introduced to the evacuatable chamber in the vicinity of the ion source where it is ionized by the ion source. These ions are attracted towards the ion collector by an impressed electrical potential, but the mass filter permits only ions having a predetermined mass-to-charge ratio to reach the collector. The current produced by the collected ions is measured for various predetermined mass-to-charge ratios to define the mass spectrum.

The mass filter typically comprises at least two electrodes disposed along the common axis, to which both radio frequency and D.C. voltages are applied. Various electrode configurations have been used, but the most widely used appears to be the quadrupole design, which has four electrodes opposing each other, in pairs, symmetrically about the common axis. Another mass filter design that has been used is called a monopole configuration, which actually has two electrodes. Still other configurations employ auxiliary electrodes. The construction and method herein disclosed are not limited to any particular electrode configuration.

In operation, the voltages impressed on the electrodes are typically on the order of several thousand volts. Typically, the electrode spacing is only a few millimeters or less. A mass spectrometer can operate on lower voltage and less power if its electrodes are close together, but this is possible only if its parts can be made and positioned with extreme accuracy. The combination of high voltage and close spacing gives rise to several problems which have not been completely solved in the art to date. A first problem, common to many high voltage systems, is that unless the electrode surfaces are extremely smooth, corona discharge from the electrodes can seriously affect the performance of the instrument. Charge build-up on the unshielded portions of the insulators can distort the electric field. Finally, the shape and relative positioning of the electrodes must be controlled with great accuracy to produce the desired quality of electrical field between the electrodes.

In each of these problem areas an art has grown up with the goal of solving the particular problem and further increasing the performance of the instrument.

It was found that the problem of charge build-up on the insulators could be bypassed by shaping the electrodes in such a manner as to shield the insulators from the active cavity or to minimize the insulator area exposed to the active cavity.

With regard to the problem of fabricating the electrodes, it was early recognized (see U.S. Pat. No. 2,939,952 to W. Paul, et al.) that although a hyperbolic shape was preferred for the electrodes, a practical approximation could be achieved through the use of electrodes having a circular cross-section instead. This greatly reduced the expense of machining the hyperbolic shape although that shape remains preferable. In addition to having the proper shape, the electrodes must have a very smooth surface finish, and the use of polished rods for electrodes is well known.

More difficult than the problem of electrode shape has been the problem of accurately positioning the electrodes with respect to each other. The accuracy desired here is on the order of 1/10,000th of an inch. Unless the instrument is carefully designed, the slightest mechanical shock can disturb the interelectrode spacings, thereby seriously degrading the performance of the mass spectrometer.

The earliest technique for mounting the electrodes is that shown in the patent to Paul, et al., referred to above. Paul shows a disc-like insulator of mica or ceramic disposed perpendicular to the common axis and having holes in it through which the ends of the rod-like electrodes pass. This arrangement is limited, of course, by the precision with which the several holes in the several discs can be machined and registered.

A different approach to the problem of mounting the electrodes is shown in the U.S. Pat. No. 3,553,451 in which the electrodes are drawn by screws into contact with the inside surface of a single large hollow ceramic insulator. An alternative approach to the positioning problem is to provide auxiliary electrodes as shown in U.S. Pat. No. 3,725,700 to Turner, for the purpose of favorably modifying the characteristics of the electric field.

Because of the necessity for precisely positioning the many parts of the mass filters constructed by the prior art methods, it can readily be appreciated that the assembly and adjusting of such units was a complex and expensive undertaking, generally requiring iterative adjustments. The present invention obviates these problems entirely.

In U.S. Pat. No. 3,328,146 to Hanlein there is taught a method for producing an electrode system for mass spectrometers. In that method, a tube of glass, plastic or tetrafluoroethylene is softened by heating so that it conforms to the shape of a stainless steel male mandrel. Upon cooling, the mandrel is removed and portions of the inner surface of the tube are metallized by vaporizing or sputtering gold onto them. The metallized portions are the electrodes.

It is apparent that the Hanlein method produces gold electrodes which are backed by a layer of glass or plastic, substances not noted for their dimensional stability during temperature changes and whose thermal expansion coefficients do not match that of gold. Further, the metal will tend to magnify any surface irregularities and contribute its own irregularities and variations in deposition thickness, as was the case with the Ball invention cited above.

A new departure from many of the above problems was disclosed in U.S. Pat. No. 3,757,115 to Ball. Ball shows a mass filter comprising a cylindrical ceramic body having an axial passage, the sides of the passage being fairly accurate hyperbolic surfaces which are plated to form electrodes. However, in the Ball structure and method, the deposition process will both tend to magnify any surface irregularities and contribute also its own irregularities and variations in deposition thickness. The working surface of the plated electrodes is not the relatively accurate surface of the axial passage but rather depends for its accuracy on the production of a smooth and uniform plating on the ceramic surface.

The Ball method requires that a separate cylindrical ceramic body be prepared for each mass filter fabricated whereas in the present invention, many mass filters can be produced from a single precisely dimensioned mandrel.

The present invention retains the advantages of the Ball structure, such as one-piece construction and true hyperbolic surfaces while overcoming Ball's dependency on the accuracy of plating process, and the relative difficulty in obtaining dimensional accuracy and repeatability in fired ceramics.

SUMMARY OF THE INVENTION

In the present invention an entirely new process is used for producing the mass filter portion of mass spectrometers. In this novel process, the shape of the electrodes is determined by forming them on a master mandrel. Within certain limitations, which will be described below, the mandrel may have any desired shape including hyperbolic. The mandrel is machined by conventional techniques, and once prepared is reuseable many times so that its original cost can be allocated to all the mass filters produced. Next, insulators are clamped into position along the surface of the mandrel. Next, a relatively thin layer of a suitable metal such as tungsten is deposited over the entire exposed surface of the mandrel and insulators. A chemical vapor deposition process has been found to produce suitable results. The deposited metal adheres to the insulators but does not adhere to the mandrel. Next, the mandrel is removed, leaving a free-standing composite structure including the insulators and the deposited metal. A portion of the deposited metal overlying the insulators is removed by etching in a preferred embodiment, thereby electrically isolating the electrodes.

Thus, the precise shape of the surfaces of the electrodes is defined by the shape of the mandrel, and because the resulting product is a free-standing unitary composite structure, the relative locations of the electrodes with respect to each other are determined precisely by the dimensions of the mandrel. In this way, the tedious manual adjustment procedure required with prior art devices is eliminated. Further, successive mass filters produced by the process are identical and interchangeable in use. Because the mandrel can be used many times, the cost of machining it, when prorated over the production run is appreciably less than the cost of machining comparable electrode surfaces on mass filters produced by prior art techniques.

The novel features which are believed to be characteristic of the invention, both as to organization and method of operation, together with further objects and advantages thereof, will be better understood from the following description considered in connection with the accompanying drawings in which several preferred embodiments of the invention are illustrated by way of example. It is to be expressly understood, however, that the drawings are for the purpose of illustration and description only and are not intended as a definition of the limits of the invention.

DESCRIPTION OF THE PREFERRED EMBODIMENT

Figure 1:
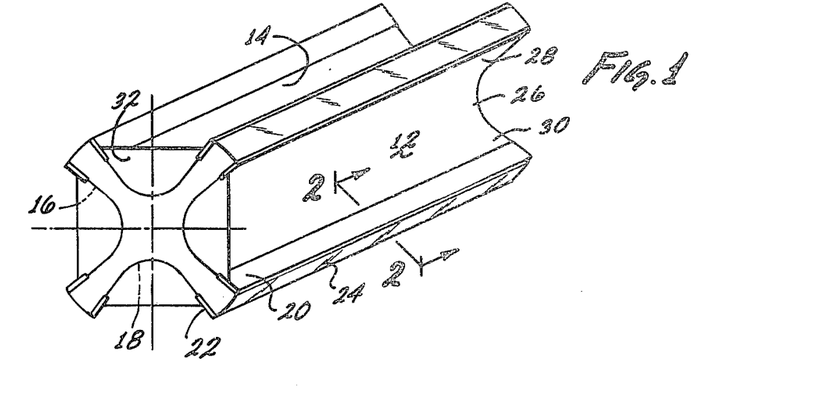
FIG. 1 is a perspective view of a preferred embodiment of the mass filter portion of a mass spectrometer.

Referring now to the drawings, there is shown in FIG. 1 a perspective view of the mass filter portion of a mass spectrometer according to the present invention. It can be seen from FIG. 1 that the mass filter comprises electrodes 12, 14, 16 and 18 having a cylindrical surface. That is, a surface generated by the movement of a straight line which constantly is parallel to a fixed straight line and which touches a fixed curve not in the plane of the fixed straight line. A combination of r.f. and d.c. potentials is applied between opposing electrodes such as 12 and 16. The ionized material being filtered passes through the mass filter in a generally axial direction in the space bounded by the electrodes and between them. Thus, it is the inner surfaces of the electrodes 12-18 of FIG. 1 that must be extremely smooth to prevent corona from the electrodes and to achieve the required symmetry of the electric field.

The electrodes 12-18 are electrically isolated from one another by eight insulators of which 20 and 22 are typical. These insulators are positioned in such a manner that they are shielded from the axis of the assembly by the curved surfaces of the electrodes, to prevent unwanted electrical charges from building up on the insulators. Also, as shown in FIG. 1, the structure includes four shield electrodes of which 24 is typical, arrayed between the insulators. These electrodes are not critical to the operation of the mass filter, although they shield the electric fields generated between the electrodes from outside influences. Their main function is to provide mechanical connection between successive electrode-insulator pairs, thereby greatly enhancing the mechanical rigidity of the assembly and to provide a ground potential surface to allow mechanical mounting of the analyzer.

Electrode 12 typifies the other electrodes in that it has a central portion 26 and edge portions 28 and 30. The central portion 26 is arched inwardly towards the axis of the assembly. The exact configuration of this curved central portion 26 is preferably hyperbolic, although the hyperbolic surface may be approximated by a circular cylindrical surface in alternative embodiments.

A thin web 32 may be provided at one or both ends of the mass filter to add further mechanical rigidity to the assembly and it contributes to smoother termination of electric field lines at the entrance and exit of the analyzer.

FIGS. 2-6 show in partial cross-sectional view, successive stages in the formation of the assembly similar to that of FIG. 1. FIGS. 2-6 show cross-sections taken in a plane perpendicular to the axis of the assembly, and for convenience, only the part of the assembly including the edge portion of two electrodes and two insulators are shown. FIGS. 2-6 are included to relate the structure of a mass filter to the process by which it is produced. The process steps will be described in greater detail at a later point.

Figure 2:
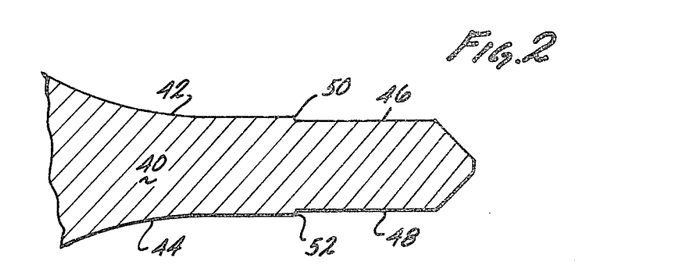
FIGS. 2-6 are a sequence of partial sectional views of an embodiment of the mass filter at various stages of its formation.

FIG. 2 shows a mandrel 40 having surfaces 42 and 44 for defining the shape of the electrode surfaces. These surfaces must be accurately machined to the predetermined shape by conventional machining techniques or by crush form grinding. Mandrel 40 typically is stainless steel in a preferred embodiment. Mandrel 40 further includes regions 46–52 for indexing the position of insulators such as 20 and 22 of FIG. 1.

It has been found desirable at this point to apply a preliminary treatment to the insulators, as will be described in detail below, to protect them during a subsequent metalizing step.

Figure 3:
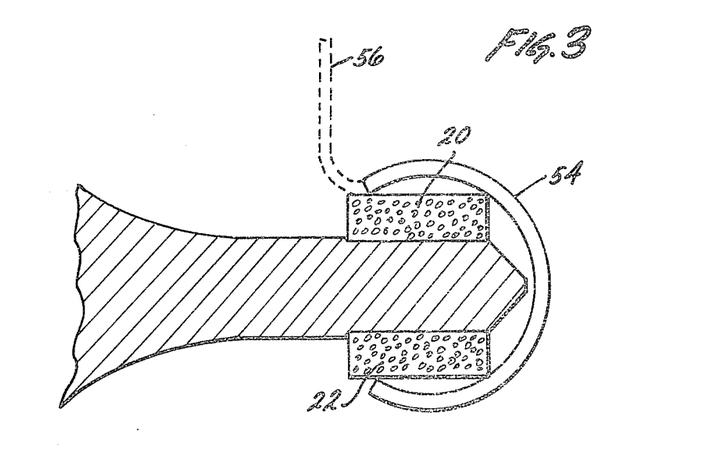

In FIG. 3, insulators 20 and 22 have been positioned on the surfaces 46 and 48 of FIG. 2, respectively. The insulators are urged against the surface of the mandrel by a clamp 54 formed, in a preferred embodiment, of 10 mil tungsten wire. If desired, the clamp 54 may include a portion 56 which at a later stage in the process, can be used as a terminal post, for making an electrical connection to the electrodes. This portion is shown in dashed lines in the Figures. Typically, four clamps such as 54 would be applied at each end of the assembly of FIG. 3.

Figures 4, 5, 6, 8:
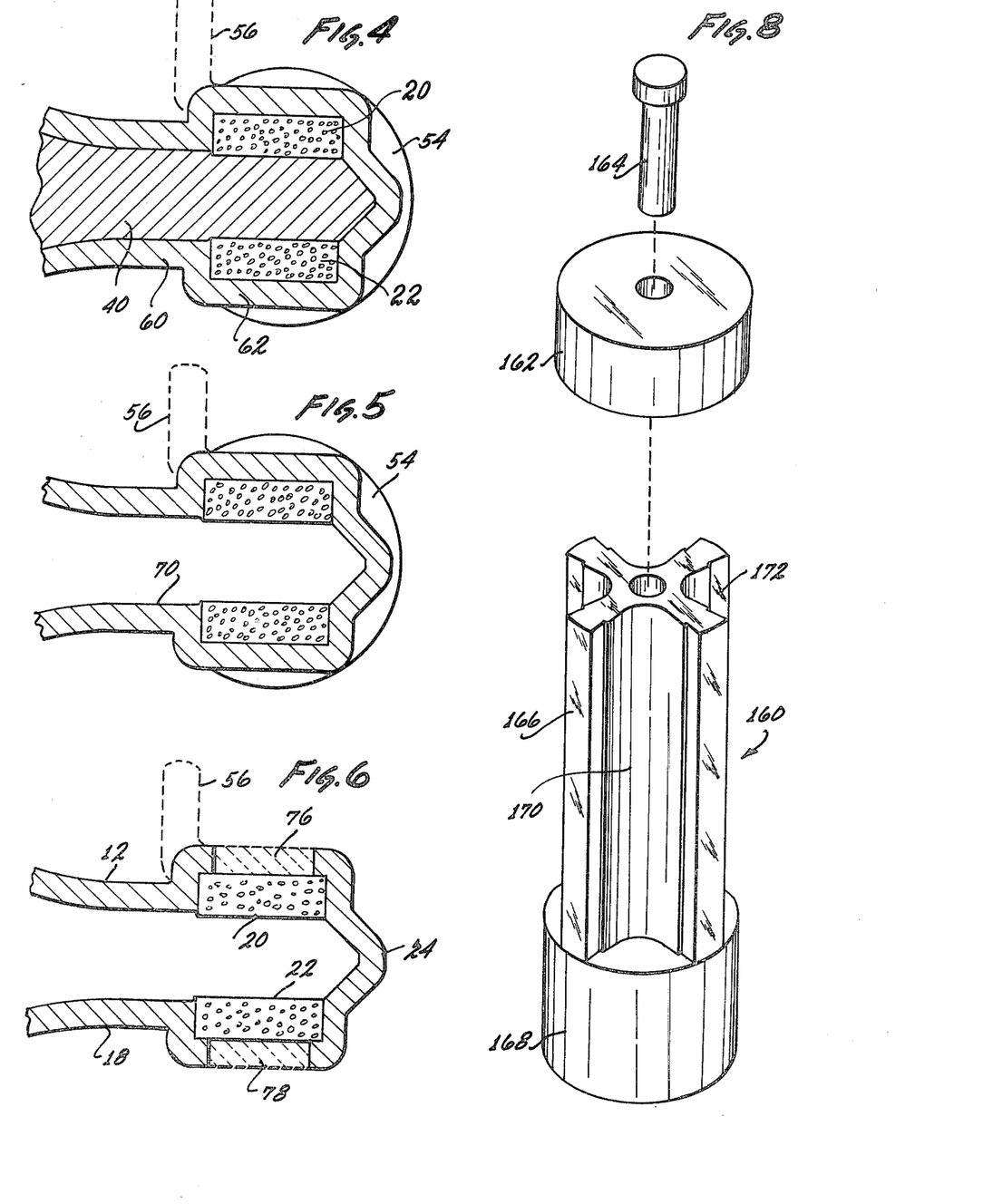
FIG. 8 is an exploded perspective view of a preferred embodiment of the mandrel.

In FIG. 4, a coating 60 of a metal, which in a preferred embodiment is tungsten, is applied over the entire exposed surface of the mandrel and the insulators. The tungsten coating 60 is applied by an involved process described below, and the thickness of coating 60 is typically 25 mils. The deposited tungsten layer 60 adheres to insulators 20 and 22, but does not adhere to the surface of the mandrel 40 because of a special treatment which was applied to the mandrel before the deposition, and which will be described below. The deposited tungsten 60 adheres to the resilient clamps 54 enlarging their diameter (not illustrated), and a portion 62 of them merges with and becomes a unitary part of the deposited layer 60.

In FIG. 5, the mandrel 40 of FIG. 4 has been removed from the assembly. As will be described below, the process by which the tungsten layer 60 was deposited is carried out at a rather high temperature, causing substantial expansion of the mandrel. In the preferred embodiment, the mandrel 40 is of stainless steel while the deposited layer 60 is of tungsten. Because the coefficient of thermal expansion of stainless steel is greater than that of tungsten, the stainless steel mandrel upon cooling contracts more than the deposited layer of tungsten. Thus, upon cooling the mandrel tends to shrink away from the inner surface 70 of the deposited layer. This permits the mandrel to be removed from the assembly by sliding it in the axial direction. The structure remaining after the mandrel has been withdrawn is relatively strong considering the wall thicknesses involved, and it may be handled without undue concern.

As shown in FIG. 6, portions 76 and 78, shown in dashed lines, have been etched away or ground away to expose the insulators 20 and 22, thereby electrically isolating the electrodes 12, 18 and 24. The undesired portion of the resilient clamp 54 has also been etched or cut away, while the desired portion such as 56, has been left as a terminal post for making electrical connection to the electrode 12.

Upon completion of the process described in connection with FIGS. 2–6, there has been produced a free-standing unitary composite structure for use as the mass filter of a mass spectrometer. The insulators connecting the electrodes of the mass filter are rigidly bonded to those electrodes thereby locating them in precisely controlled positions. Because a complete filter is fabricated by the process, further assembly of the filter is not required and thus, the tedious manual adjustments required by prior art devices have been eliminated. It will be noted, that the mandrel, after having been withdrawn from the assembly, can be used again and again, because it is not altered by the process. Reuse of the mandrel results in lower cost per unit produced and assures that all of the mass filters produced on that mandrel have identical precise and accurate dimensions and hence are interchargeable.

It can be appreciated, that numerous other cross-sectional configurations than the one shown in FIG. 1 are compatible with the process described above. For example, the so-called monopole mass spectrometer has only two electrodes instead of the four electrodes illustrated in FIG. 1. Further, the desirability of fabricating in the same step still other parts of the mass spectrometer such as the ion source and the ion collector is recognized.

There are, however, several limitations imposed by the process that must be considered. As mentioned above, the coefficient of thermal expansion of the mandrel must exceed that of the metallic coating, if the mandrel is to be withdrawn from the assembly at a lower temperature than that at which the deposition was carried out. Secondly, it must be remembered that expansion and contraction of the mandrel occurs in the radial direction as well as in the circumferential direction. As a result, the cross-sectional shape of the mandrel must not include any reentrant portions which would cause the mandrel to become locked against the deposited material upon cooling. This requirement can be met by designing the electrode surfaces so that, as seen from the central axis of the assembly, no portion of the electrode surface is obscured by another portion of that surface. That is, a straight line drawn from the axis to any point on the surface should intersect the surface at only one point.

The materials chosen must, of course, be compatible with the process used to deposit the metallic layer. In this respect, the best materials for the metallic layer are tungsten, molybdenum and rhenium. These metals are all capable of being deposited at practical temperatures by reduction of halides of the metals, such as the pentachlorides or hexafluorides, and these metals all have coefficients of thermal expansion less than that of the mandrel. Several other materials including chromium, columbium and tantalum also have useable coefficients of expansion but react at more extreme temperatures. These reactions are described in greater detail in the chapter on chemical vapor deposition techniques in *Techniques of Metals Research*, Vol. 1, part 3, edited by Bunshaw, Interscience, 1968, and in the book *Vapor Deposition*, by Powell, Oxley and Biocher, Wiley, 1966.

The mandrel, in addition to having an appropriate coefficient of thermal expansion relative to that of the deposited material must exhibit dimensional stability at the relatively high temperatures required, and must not react with the compounds used in or formed during the process.

The material chosen for the insulators must have a coefficient of thermal expansion substantially matching that of the deposited metal, should not be subject to structural degradation at elevated temperatures, and should not be subject to attack by the compounds used in or formed during the process. Zirconium silicate has been found to be an excellent insulator for use with deposited tungsten because of its thermal coefficient match, but it must be protected from the compounds formed during the process.

The present invention is not a process for depositing a tungsten or metallic coating on a mandrel. Instead, what is disclosed here is a method for forming a relatively intricate unitary composite structure having electrically isolated electrodes and having dimensional tolerances on the order of 2/10,000 inch or better. The chemical vapor deposition of a metallic coating is but one step in the new and useful process disclosed herein for forming the mass spectrometer filter. The process for depositing the metallic coating will be described in some length below to enable those skilled in the art to practice the present invention. The process of the present invention further comprises certain necessary preparatory steps which are disclosed below. Experience has shown that these steps are essential to the successful formation of the composite structure disclosed herein, and it has been found that the known processes for depositing the metallic layer will not result in successful formation of the composite structure without the additional steps disclosed below.

In U.S. Pat. No. 3,072,983, issued Jan. 15, 1963, Brenner and Reid describe a process for the vapor deposition of tungsten. In their process, the object to be coated is heated to a temperature above 300° C. and then subjected to a gas mixture consisting of tungsten hexafluoride and hydrogen gas. Brenner also claims a process for forming an object of tungsten comprising the steps of coating a mandrel wih tungsten and then dissolving the mandrel with an acid to which tungsten is insensitive. By contrast, it is a feature of the present invention that the mandrel can be used again and again.

Figure 7:
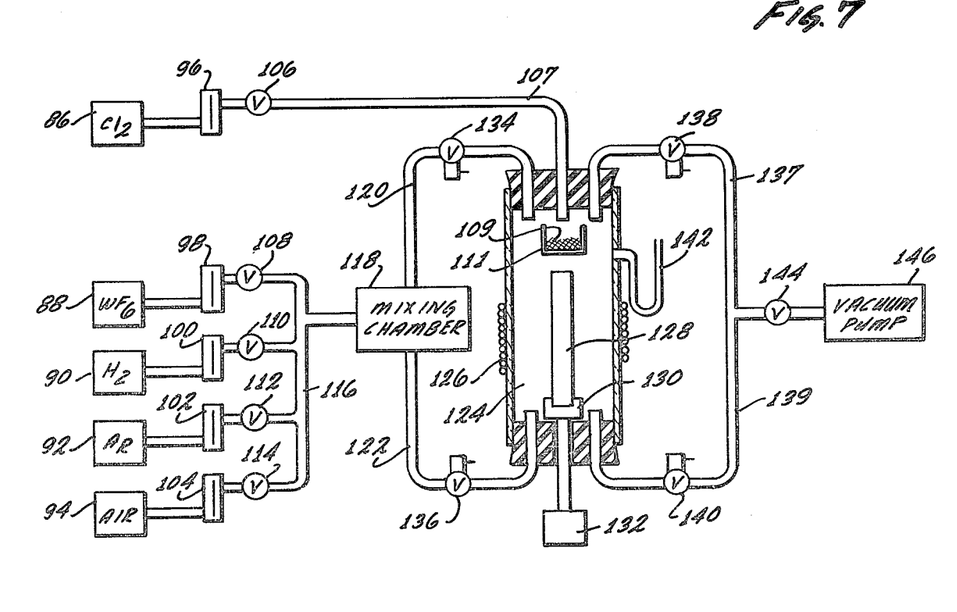
FIG. 7 is a schematic diagram of the apparatus used for carrying out the chemical vapor deposition process used in producing a preferred embodiment of the mass filter.

Later, it was found that secondary reactions in which various subfluorides are formed accompany the primary reaction described in the Brenner patent. The subfluorides formed in these secondary reactions are solids at the deposition temperatures and these solids become included in the deposited tungsten thereby impairing its strength and making it less suitable for use at elevated temperatures, at which the included subfluorides vaporize leaving voids. Holzl in U.S. Pat. No. 3,565,676, issued Feb. 23, 1971, solved this problem by continuously introducing into the process a controlled amount of oxygen or oxygen-forming material. This controls the quantity of entrapped solid subfluorides in the deposited coating by oxidizing the subfluoride to a gaseous state during the chemical vapor deposition process, thereby allowing escape of the fluorine from the system. In the present invention, the tungsten coating is deposited by the method disclosed by Holzl in the above-referenced patent. FIG. 7 shows apparatus for use in the Holzl process.

In FIG. 7 a number of sources of the gases used in the process are denoted by 86–94. These sources are connected through flow meters 98–104 and manually operated valves 108–114 to manifold 116. Manifold 116 leads to mixing chamber 118 which is used to promote uniformity of the mixture being fed to the deposition chamber.

From mixing chamber 118 the mixed gases can flow to deposition chamber 124 by either of two routes: upper feed tube 120 or lower feed tube 122. These feed tubes are provided with electrically controlled valves 134 and 136, respectively. Gases are exhausted from the deposition chamber 124 through either of two paths: upper exhaust pipe 137 and lower exhaust pipe 139. These exhaust pipes are provided with electrically controlled valves 138 and 140, respectively. The total pressure of the gas in the mixing chamber is controlled by manual valve 144 which is connected to vacuum pump 146. It is understood that in operation valves 134 and 140 are either both open or both closed at any particular time. Likewise, valves 136 and 138 are also operated in unison. This valving arrangement enables downward flow when valves 134 and 140 are open and enables upward flow when valves 136 and 138 are both open. As will be seen below, the direction of flow is reversed from time to time to promote uniformity of the deposition. The pressure of the gas in the deposition chamber is measured by use of manometer 142.

Those skilled in the art will understand that other combinations of pressure, temperature and flow rate or direction than those described herein might be utilized to attain uniformity of deposition and a desirable metallic structure.

Mandrel 128 is mounted in holder 130 which can be rotated by motor 132 or other means. Mandrel 128 is heated by induction heating coils 126, and the temperature of the mandrel is monitored by an optical or infrared pyrometer not shown in FIG. 7. It is understood that other, substantially equivalent apparatus, may be used in place of that shown in FIG. 7.

FIG. 8 is an exploded perspective view showing the structure of the mandrel 128 used in a preferred embodiment. The mandrel includes three parts: the main portion 160, an end piece 162, and a pin 164 for positioning the end piece on the main portion. In an alternative embodiment, the means for positioning the end piece must be part of either the end piece or the main portion. The main portion includes a cylindrical portion 166 and a shank portion 168. The cylindrical portion 166 has electrode-defining surfaces of which surface 170 is typical. The cylindrical portion further includes insulator-positioning grooves of which groove 172 is typical.

An example of the process of the present invention used for producing the mass filter will now be described in view of the apparatus of FIG. 7. Briefly, the process comprises plating the insulator with a layer of molybdenum, preparing the mandrel, and of plating a tungsten layer over the mandrel and insulators. In the preferred embodiment described below, the insulators are coated with molybdenum; other metals, such as nickel, rhenium and platinum would be acceptable alternatives. The metal used to plate the insulators should be chemically severable from the tungsten, should match approximately the thermal expansion coefficient of the ceramic, and should be depositable by a practical technique. The above-named metals share these properties in common. In a preferred embodiment, a vapor deposition technique is used to apply the metallic coating to the insulators.

As mentioned above, the insulators are elongate strips of zirconium silicate. Their length must be controlled to be within 0.001 inch of the predetermined value because if they are too long the end piece will not seat on the mandrel and if they are too short, tungsten will be deposited between the end piece of the mandrel and the end of the insulator. Next, each insulator is cleaned with an absorbent lint-free paper which has been saturated with denatured alcohol, and thereafter is dried with dry absorbent lint-free paper. Tweezers are thereafter used to carefully place each insulator into a plating rack.

The plating rack holding the insulator is then placed in the deposition chamber 124 and the chamber is purged with argon and tested for leaks. Valves 112 and 110 are then opened to achieve gas flow rates of 1600 milliliters per minute of argon and 800 milliliters per minute of hydrogen, as determined from flow meters 102 and 100. Induction heater 126 is then energized, which heats both the plating rack containing the insulators and a chip pot 111 containing chips of molybdenum and located in the upper part of chamber 124. The plating rack temperature is stabilized between 815° C. and 840° C. and the chip pot temperature is stabilized at approximately 650° C. These temperatures are maintained for a minimum of ten minutes before plating is initiated. To initiate plating, the flow of argon is increased to 3200 milliliters per minute and the flow of hydrogen is increased to 1600 milliliters per minute. Valve 106 is opened to start the flow of chlorine gas and its flow rate is increased to 1600 milliliters per minute over a 30 second period. The chlorine gas reacts with the heated molybdenum chips to form hot gaseous MoCl$_5$ which is thereafter reduced by the hydrogen gas on the surface of the insulators to deposit a coating of molybdenum on that surface, the reaction being:

$$MoCl_5 + \tfrac{5}{2} H_2 \longrightarrow Mo\downarrow + 5HCl\uparrow.$$

After flowing at 1600 milliliters per minute for three minutes, the chlorine is then shut off and the induction heater is deactivated. The flow of hydrogen and argon are continued for at least 30 minutes to cool the parts, which are then removed from chamber 124 along with chip pot 111.

The molybdenum-plated insulators are then inspected. Their length is held to a tolerance of +0.000, −0.005 inches and it may be necessary to grind off any excessive molybdenum.

The step of depositing the tungsten coating comprises two major portions: preparation of the mandrel, and the actual tungsten deposition. The mandrel is prepared by forming a barrier between it and the deposited material. This barrier may be created by oxidizing the surface of the mandrel, or by applying a foreign substance to it as in the preferred embodiment described below. Oxidizing the surface of the mandrel is less desirable because with repetition it alters the dimensions of the mandrel, thereby shortening its useful life.

The mandrel is always handled with inspection gloves or dry, lint-free paper. First, the mandrel is cleansed with a solvent such as acetone and thoroughly dried. The mandrel 128 is then attached to holder 130. Next, all exposed surfaces of the mandrel are wiped with an absorbent lint-free paper saturated with dibutyl sebacate. The excess dibutyl sebacate is wiped off with a dry lint-free paper. Next, the deposition chamber is purged with argon and tested for leaks. Valve 112 is opened to permit argon to flow at 850 milliliters per minute and valve 144 is adjusted to set the chamber pressure at between 100 and 110 torr. Next, the induction heater is energized and the temperature of the mandrel is stabilized at 550° C.–600° C. Valve 110 is opened to permit a flow of hydrogen at the rate of 2600 milliliters per minute, and the argon is then turned off by closing valve 112. The mandrel is maintained at the above temperature for 15 minutes after which the induction heater is deactivated and the flow of hydrogen is shut off by closing valve 110. Then, the argon flow is restarted by opening valve 112 to permit argon to flow at 850 milliliters per minute. The mandrel is cooled by the flowing argon for 30 minutes before it is removed from the chamber. The entire above procedure for preparing the mandrel is then repeated.

Dibutyl sebacate is a viscous liquid monomer that polymerizes when heated to form a pyrolized layer on the mandrel which greatly reduces adhesion between the mandrel and the deposited tungsten. Although dibutyl sebacate is used in the preferred embodiment, it is recognized that many other substances could be used. The main requirements are that the substance have a low vapor pressure so that as heat is applied it will polymerize before vaporizing and will then reach a temperature sufficiently high to pyrolize it.

After the mandrel has been prepared as described above, the molybdenum-plated ceramic insulators are affixed to the mandrel as described above in connection with FIG. 3. This assembly is then returned to its holder 130 inside the deposition chamber 124. Again, the chamber is flushed with argon and tested for leaks. Both the upper and lower exhaust valves 138 and 140, respectively are opened and a flow of argon at the rate of 850 milliliters per minute is initiated by opening valve 112. The chamber pressure is adjusted to 110 torr by manipulating valve 144. The induction heater is energized and the mandrel temperature is stabilized at 575° + or − 25° C. Next, valve 110 is opened to provide a flow of hydrogen at 2300 milliliters per minute, and the flow of argon is then turned off by valve 112. At this point, it is necessary to stabilize the mandrel temperature at 525° C.–550° C. Valve 108 is then opened to permit a flow of tungsten hexafluoride at a rate of 510 milliliters per minute. The temperature will tend to increase rapidly when the tungsten hexafluoride flow is started and it is necessary to monitor the operation closely to maintain the mandrel temperature between 525° C. and 550° C. It is important that the temperature of the mandrel not exceed 550° C.

The tungsten hexafluoride is reduced by the hydrogen, the reaction being:

$$WF_6 + 3H_2 \rightleftarrows W\downarrow + 6HF.$$

After this condition has been maintained for five minutes, valve 114 is opened to inject a flow of air at the rate of 6 milliliters per minute into the inlet manifold 116. The plating is continued for an additional 15 minutes and then, the lower exhaust valve 140 is closed, diverting all flow through upper exhaust valve 138 which remains open. Plating is continued for an additional 130 minutes in the upflow mode. After 150 minutes total plating time, the induction heater is deactivated and the flow of air and tungsten hexafluoride is discontinued. Next, the tungsten coated parts are cooled by a flow of hydrogen for 10 minutes and then by a flow of argon at the rate of 1150 milliliters per minute for an additional 30 minutes. It has been found that the above process results in a tungsten coating from 30 to 36 mils in thickness.

When the tungsten coated assembly has cooled, it is removed from the deposition chamber 124 and the assembly is substantially as shown in FIG. 4. As described above in connection with FIGS. 5 and 6, the assembly is gently withdrawn from the mandrel in an axial direction, and the unwanted portions of the insulator retaining clamps 54 may then be removed.

The unwanted portions of the tungsten coating, 76 and 78 of FIG. 6, which overlie the insulators 20 and 22 are then etched away by an electrolytic sodium hydroxide process, and the molybdenum coating of the insulators is etched away by a mixture of hydrochloric and nitric acid. After cleansing, the mandrel is ready for use again.

It has been found that the process described above permits the formation of relatively intricate unitary composite structures having electrically isolated electrodes and having dimensional tolerances on the order of 2/10,000 inch or better.

Thus, there has been described a process for producing a unitary composite free-standing structure for use as the mass filter of a mass spectrometer. The process results in lower cost because the mandrel, which is expensive to machine, can be used again and again. The mass filters produced by this method are substantially identical and interchangeable. Because the mass filter is produced with the precise tolerances required, no further adjustments are necessary to place the mass filter into use.

From the above description it would be clear to those skilled in the art that, if desired, an unbacked metallic structure could be produced, having no insulators but including one or more electrode surfaces defined by a mandrel and suitable for use in a mass filter. The present invention affords a very attractive electrode structure for use in mass filters and similar apparatus because the active surface of the electrode conforms exactly to the desired shape expressed by the mandrel.

The foregoing detailed description is illustrative of one embodiment of the invention, and it is to be understood that additional embodiments thereof will be obvious to those skilled in the art. The embodiments described herein together with those additional embodiments are considered to be within the scope of the invention.

What is claimed is:

1. A method for forming a mass filter for use in a mass spectrometer, comprising the steps of:
    (a) forming a mandrel having precisely controlled dimensions, including electrode-forming surfaces and insulator positioning surfaces;
    (b) polishing the electrode-forming surfaces;
    (c) applying an adhesion-reducing coating to the surface of the mandrel;
    (d) affixing insulators in contact with the mandrel at the insulator-positioning surfaces;
    (e) heating the mandrel and insulators;
    (f) reducing gaseous metal halide on the surface of the heated mandrel and insulators, whereby a layer of metal is deposited on the mandrel and insulators, adhering to the insulators and creating electrode surfaces on said electrode forming surfaces;
    (g) cooling the mandrel, insulators, and deposited metal, whereby differences in thermal expansion cause release of the deposited metal from the mandrel;
    (h) separating from the mandrel the deposited metal which is now bonded to the insulators forming a one-piece, self-supporting structure; and
    (i) removing sufficient portions of the deposited metal overlying the insulators to create insulative paths electrically isolating the electrode surfaces created on the electrode forming surfaces.

2. The method of claim 1 wherein the adhesion-reducing coating is formed by oxidizing the surface of the mandrel.

3. The method of claim 1 wherein the adhesion-reducing coating is a pyrolized coating of an organic material.

4. The method of claim 1 wherein the adhesion-reducing coating is dibutyl sebacate.

5. The method of claim 1 wherein step (f) is continued until the layer of metal deposited has reached a thickness of at least 0.010 inches.

6. The method of claim 1 wherein the metal halide is selected from the group consisting of tungsten, molybdenum, rhenium, chromium, tantalum and columbium halides, and wherein the mandrel has a larger coefficient of thermal expansion than the metal deposited.

7. The method of claim 1 wherein the metal halide is selected from the group consisting of tungsten, molybdenum and rhenium halides, and wherein the mandrel has a larger coefficient of thermal expansion than the metal deposited.

8. The method of claim 1 wherein the metal halide is tungsten hexafluoride, the mandrel is stainless steel, and wherein the reduction step is carried out at a temperature between 300° C. and 800° C., and at a total pressure between 50 torr and 150 torr.

9. The method of claim 1 wherein the step of affixing insulators further comprises the steps of affixing the insulators to the mandrel by resilient clips and of removing unwanted portions of these clips from the structure during step (i).

10. The method of claim 1 wherein the step of forming a mandrel further comprises forming a mandrel having a cylindrical surface of constant cross-section extending parallel to a predetermined axis.

11. The method of claim 1 wherein the mandrel has a cylindrical surface with a cross-section bounded by a closed figure, from every point of which a straight line drawn to the axis does not intersect any portion of the figure, whereby the surface of the mandrel does not have any reentrant portions, thereby facilitating release of the mandrel.

12. The method of claim 1 further comprising the step of metallizing the insulators before affixing them to the mandrel, the metallized layer being removed in step (i).

13. The method of claim 12 wherein the insulators are metallized with a layer of molybdenum.

14. The method of claim 1 wherein the insulators are zirconium silicate.

15. A method for forming a mass filter for use in a mass spectrometer, comprising the steps of:
    forming a mandrel having precisely controlled dimensions, including electrode-forming surfaces and insulator positioning surfaces;
    affixing insulators in contact with the mandrel at the insulator-positioning surfaces;
    heating the mandrel and insulators;
    reducing gaseous metal halide on the surface of the heated mandrel and insulators, whereby a layer of metal is deposited on the mandrel and insulators, adhering to the insulators and creating electrode surfaces on said electrode forming surfaces;
    cooling the mandrel, insulators and deposited metal, whereby differences in thermal expansion cause release of the deposited metal from the mandrel;
    separating from the mandrel the deposited metal which is now bonded to the insulators forming a one-piece self-supporting structure; and
    removing sufficient portions of the deposited metal overlying the insulators to create insulative paths electrically isolating the electrode surfaces created on the electrode forming surfaces.

16. The method according to claim 15 wherein the step of forming the mandrel further comprises forming a mandrel surface portion having a concave substantially cylindrical shape that is uniform with respect to a center mandrel axis along the length of the mandrel.

17. The method according to claim 15 wherein the step of forming the mandrel further comprises forming a plurality of concave substantially cylindrical surface portions that are each uniform in shape with respect to a center mandrel axis along the length of the mandrel, edges of the cylindrical surfaces being joined together along the length of the mandrel by flat surfaces on opposite sides of a lip that include the insulator positioning surfaces.

18. The method according to claim 17 wherein the step of affixing insulators further comprises the step of affixing an elongated thin piece of electrically insulating material on each of said insulator positioning surfaces by resilient clips, and wherein the step of removing material from the insulators further comprises the step of removing unwanted portions of these clips from the structure.

19. A method of forming a mass spectrometer mass filter on a mandrel having precisely controlled dimensions including electrode-forming surfaces and insulator positioning surfaces, comprising the steps of:
affixing insulators in contact with the mandrel at the insulator-positioning surfaces;
heating the mandrel and insulators;
reducing gaseous metal halide on the surface of the heated mandrel and insulators, whereby a layer of metal is deposited on the mandrel and insulators, adhering to the insulators and creating electrode surfaces on said electrode forming surfaces;
separating from the mandrel the deposited metal which is now bonded to the insulators forming a one-piece self-supporting structure; and
removing sufficient portions of the deposited metal overlying the insulators to create insulative paths electrically isolating the electrode surfaces created on the electrode forming surfaces.

20. The method according to claim 19 wherein the step of reducing gaseous metal halide is continued until the layer of metal deposited has reached a thickness of at least 0.010 inches.

21. The method according to claim 19 wherein the metal halide is selected from the group consisting of tungsten, molybdenum, rhenium, chromium, tantalum and columbium halides.

22. The method according to claim 19 wherein the metal halide is selected from the group consisting of tungsten, molybdenum and rhenium halides.

23. The method according to claims 21 or 22 wherein the mandrel has a larger coefficient of thermal expansion than the metal deposited, thereby to permit release of the deposited material from the mandrel upon cooling.

24. The method according to claim 19 wherein the metal halide is tungsten hexafluoride, the mandrel is stainless steel, and wherein the reduction step is carried out at a temperature between 300° C. and 800° C., and at a total pressure between 50 torr and 150 torr.

25. The method according to claim 19 wherein the step of affixing insulators further comprises the step of affixing the insulators to the mandrel by resilient clips and the step of removing material from the insulators further comprises the step of removing unwanted portions of these clips from the structure.

26. The method according to claim 25 wherein the step of affixing the insulators to the mandrel by resilient clips includes affixing clips that are electrically conductive and at least some of which have a protruding pin located so as not to be removed during the step of removing unwanted portions of the clips from the structure, whereby terminal posts are formed for electrical connection with the remaining conductive surfaces.

27. The method according to claim 19 wherein the mandrel has a cylindrical surface with a cross-section bounded by a closed figure, from every point of which a straight line drawn to the axis does not intersect any portion of the figure, whereby the surface of the mandrel does not have any reentrant portions, thereby facilitating release of the mandrel.

28. A method of forming a structure on a mandrel surface, comprising the steps of:
placing at least one electrical insulator on said mandrel that covers only a portion of the mandrel surface, thus leaving exposed the remaining mandrel surface,
coating said at least one insulator and the exposed mandrel surface with a continuous conductive layer of material having a sufficient thickness and mechanical properties to form a unitary self-supporting structure that is bonded to said at least one insulator and holds its shape conforming to the mandrel surface when removed therefrom,
separating from the mandrel the unitary self-supporting structure, and
removing at least a portion of the coated material overlying said at least one insulator to create an insulative path that electrically isolates adjacent portions of the coated conductive layer of material.

* * * * *